(12) United States Patent
Gumbrecht et al.

(10) Patent No.: US 9,830,711 B2
(45) Date of Patent: Nov. 28, 2017

(54) METHOD AND MAGNETIC RESONANCE APPARATUS FOR CORRECTION OF A B0 MAP FOR CHEMICAL SHIFTS

(71) Applicant: Siemens Aktiengesellschaft, Munich (DE)

(72) Inventors: Rene Gumbrecht, Herzogenaurach (DE); Michael Koehler, Nuremberg (DE); Rainer Schneider, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 499 days.

(21) Appl. No.: 14/603,629

(22) Filed: Jan. 23, 2015

(65) Prior Publication Data
US 2015/0204955 A1    Jul. 23, 2015

(30) Foreign Application Priority Data
Jan. 23, 2014   (DE) .................. 10 2014 201 207

(51) Int. Cl.
*G01R 33/24*    (2006.01)
*G06T 7/00*    (2017.01)
(Continued)

(52) U.S. Cl.
CPC .......... *G06T 7/0093* (2013.01); *G01R 33/243* (2013.01); *G01R 33/4828* (2013.01);
(Continued)

(58) Field of Classification Search
CPC ... G06T 7/162; G06T 7/0012; G01R 33/5608; G01R 33/4828; G01R 33/56527; G01R 33/243; G01R 33/5615; G01R 33/56563
See application file for complete search history.

(56) References Cited

U.S. PATENT DOCUMENTS

| | | | |
|---|---|---|---|
| 2009/0174403 A1* | 7/2009 | Lu ....................... | G01R 33/243 324/307 |
| 2010/0283463 A1 | 11/2010 | Lu et al. | |
| 2011/0254547 A1 | 10/2011 | Reeder et al. | |
| 2013/0315463 A1* | 11/2013 | Vilsmeier .......... | G01R 33/5608 382/131 |

OTHER PUBLICATIONS

Dagher et al., "High-Resolution, Large Dynamic Range Field Map Estimation," Magnetic Resonance in Medicine (2013), pp. 1-13.
(Continued)

*Primary Examiner* — G. M. Hyder
(74) *Attorney, Agent, or Firm* — Schiff Hardin LLP

(57) ABSTRACT

In a method for correction of a B0 field map measured with a magnetic resonance device, that describes deviations from a nominal field strength in the homogeneity area of the magnetic resonance device by deviations from a nominal frequency for protons bonded to water, the deviations being represented as Larmor frequency values for different picture elements shifted by chemical shifts, the B0 field map is recorded with spins of the fat and water protons not in phase. The B0 field map is segmented by evaluating the differences of the Larmor frequency values of adjacent picture elements of the B0 field map in at least two contiguous clusters. For each cluster, a decision is made on the basis of a smoothness criterion and a compactness criterion as to whether a cluster containing a majority of protons bonded into fat is involved. Clusters identified as containing a majority of protons bonded into fat are corrected by lowering the Larmor frequency values by the difference between the nominal frequency for protons bonded into water and the corresponding nominal frequency for protons bonded to fat.

14 Claims, 2 Drawing Sheets

(51) Int. Cl.
G01R 33/48 (2006.01)
G01R 33/56 (2006.01)
G01R 33/565 (2006.01)
G01R 33/561 (2006.01)

(52) U.S. Cl.
CPC ...... *G01R 33/5608* (2013.01); *G01R 33/5615* (2013.01); *G01R 33/56527* (2013.01); *G01R 33/56563* (2013.01)

(56) References Cited

OTHER PUBLICATIONS

Felzenszwalb et al., "Efficient Graph-Based Image Segmentation," International Journal of Computer Vision, No. 59(2) (2004), pp. 167-181.

Funai et al., "Regularized Field Map Estimation in MRI," IEEE Transactions on Medical Imaging, vol. 27, No. 10 (2008), pp. 1484-1494.

Robinson et al., "B0 Mapping With Multi-Channel RF Coils at High Field," Magnetic Resonance in Medicine, vol. 66 (2011), pp. 976-988.

Bernstein et al., "Handbook of MRI Pulse Sequences," Elvesier Academic Press, Amsterdam (2004), pp. 558-567.

Dagher et al., "A method for efficient and robust estimation of low noise, high dynamic range B0 maps," Proc. Intl. Soc. Mag. Reson. Med., vol. 20 (2012), p. 613.

Woo et al., "Cluster-extent based thresholding in fMRI analyses: Pitfalls and recommendations," NeuroImage, vol. 91 (2014), pp. 412-419.

* cited by examiner

METHOD AND MAGNETIC RESONANCE APPARATUS FOR CORRECTION OF A B0 MAP FOR CHEMICAL SHIFTS

BACKGROUND OF THE INVENTION

Field of the Invention

The invention relates to a method for correcting a B0 field map measured with a magnetic resonance device, describing deviations from a nominal magnetic field strength in the homogeneity range of the magnetic resonance device by deviations from a nominal Larmor frequency for protons bonded into water, containing the deviations as Larmor frequency values for different picture elements in respect of chemical shifts of the Larmor frequencies, wherein the B0 field map has been recorded at least partly with spins of the protons bonded into fat and water that are not in phase, especially using a multi-echo method. The invention also relates to a magnetic resonance device and to a computer program.

Description of the Prior Art

Magnetic resonance imaging and its fundamentals are widely known. An object to be examined is introduced into a basic magnetic field with a relatively high field strength, known as the B0 field. In order to be able to acquire magnetic resonance data, in a slice of a subject for example, the nuclear spins of this slice are excited and the decay of this excitation is evaluated as a signal, for example. By operation of a gradient coil arrangement, gradient fields can be created, while radio-frequency excitation pulses, which are frequently referred to as radio-frequency pulses, are being radiated by a radio-frequency coil arrangement. Through the totality of the radio-frequency pulses (excitation), a radio-frequency field is created that is generally referred to as the B1 field, which flips (deflects) the spins of resonantly-excited nuclei locally resolved by the gradients by a so-called flip angle in relation to the magnetic field lines of the basic magnetic field. The excited spins of the nuclei then emit the radio-frequency signals, which can be picked up by suitable receive antenna, in particular also by the radio frequency coil arrangement itself, and can be further processed in order to be able to reconstruct magnetic resonance image data in this way.

In relation to the basic magnetic field however, even in the so-called homogeneity area of the magnetic resonance device in which the imaging is operated, deviations can occur that can lead to a degradation of the resulting image quality. The effective inhomogeneity of the B0 field is dependent on technical imperfections, but also on different susceptibility effects produced by the examination object, such as a patient, that differ individually. The reliable and robust measurement and imaging of this basic field recording continues to be the subject of current research.

To measure the basic magnetic field (B0 field), referred to as B0 mapping, magnetic resonance data are usually recorded (acquired) at two different echo times, preferably by gradient echo imaging. The phase difference (phase change) of the magnetic resonance data recorded at these different echo times, which can be established for example by subtraction of the phases of two magnetic resonance images of the first magnetic resonance data recorded at different echo times, is proportional to a deviation of the local B0 field from the nominal basic magnetic field strength and to the dephasing time, i.e. the difference of the two echo times. The field deviation is described in such cases by a deviation of the Larmor frequency from a nominal Larmor frequency for protons of the magnetic resonance device bonded to water (a variable describing this deviation is usually referred to below as the Larmor frequency value).

The phase created by deviations in the homogeneity of the B0 field thus develops over time, but the effect of the Nyquist phase wrapping must be taken into consideration, since the proportionality of the phase difference of magnetic resonance data recorded at different times to the deviation from the nominal Larmor frequency and the difference of the echo times applies only as long as a phase difference of $2\pi$ corresponds to the actual phase evolution. Depending on the dynamic range of the B0 distribution, the phases can continue to develop locally, however, by multiples of $2\pi$. This leads to ambiguities and errors in the calculation of the B0 maps. Incorrect assignments in the phase evolution become evident in non-physical spatial jumps as a result of the $2\pi$ jumps in the phase difference images. This means, when the deviation of the local Larmor frequency from the nominal Larmor frequency is high, that an extremely fast development of the B0 phase also occurs, so that when the echo time (here the difference of the two echo times) is not short enough the phase will have extended beyond $2\pi$, so that the described ambiguity occurs.

The selection of extremely short dephasing times is often not possible because of the sequences used wherein, with an extremely short echo time difference, smaller deviations from the nominal Larmor frequency can no longer be measured with sufficient accuracy.

A number of approaches are known for resolving the ambiguity problem in the assignment of the measured phase change. Thus it is possible to select the dephasing time, i.e. the difference between the echo times, so short that the phases do not develop by more than $2\pi$ at any location during this time. Since the dynamic range of the B0 field distribution is not known before the measurement however, the dephasing time must be selected so short that the sensitivity of the recording method is not sufficient and this method of operation is thus, as previously explained, not used.

It has therefore been proposed that phase jumps in the B0 maps be detected and corrected in post processing, assuming that the B0-field is spatially continuous. Algorithms that do this are referred to as phase unwrapping algorithms. However the reliability of such algorithms is frequently called into question. The main difficulty is because the overall volume can be composed of non-contiguous part regions, so that the individual part regions of the B0 maps are separated by voxels which only contain noise and are very signal-poor. Thus the phase in these voxels cannot be determined or can only be determined very unreliably.

It has also been proposed that magnetic resonance data be recorded with increasing dephasing time, thus with increasing difference between the echo times. The shortest dephasing time is selected in such cases so that no spatial phase jumps occur. From the recordings with shorter dephasing times it is estimated whether a phase jump will occur with a longer dephasing time. If so, this is taken into account in the evaluation (reconstruction) of the first magnetic resonance data with a longer dephasing time. The phase ambiguity is thus resolved and long dephasing times for a high sensitivity are made possible.

In an article by J. Dagher et al, "High-resolution, large dynamic range field map estimation", Magn. Reson. Med. 71 (2014) 105-117, as well as other publications, so-called multi-echo methods have been described. The detection of echoes for different dephasing times in such methods has been shown to be the variant with the best prospects. In such cases methods have also been proposed in which, during a measurement process, i.e. after an excitation, a number of echoes were recorded so that different dephasing times are also produced for a single measurement. Of significance for a high-quality and reliable determination of the B0 field map is the selection of the dephasing times. In this context it is known from an article by Joseph Dagher et al., "A method for efficient and robust estimation of low noise, high dynamic range B0 maps", Proc. Intl. Soc. Mag. Reson. Med. 20 (2012), Page 613, that an optimization approach can be used for determining the dephasing times which is based on simulated annealing, wherein other variants have also already been proposed.

With these multi-echo methods, i.e. methods with a number of different dephasing times, although the problem of phase wrap because of high off resonances is resolved, there is the additional problem of chemical shift when using variable echo time pairings. The chemical shift causes the resonant frequency of a spin ensemble to depend for a given B0 field on the chemical bonding. Therefore different Larmor frequencies with the same B0 field are produced for components of different chemical bonding, for example protons bonded into fat and water. Between fat and water this difference amounts to around 3.5 ppm.

Phase-based B0 mapping methods now measure how the spatial distribution of the deviations of the resonance frequencies from the nominal Larmor frequency of the magnetic resonance device were presented as a B0 map. The nominal Larmor frequency of a magnetic resonance device usually relates to protons bonded into water, so that the Larmor frequency values in the B0 field map only correspond to B0 deviations if the resonant frequency of water spins is considered. If both fat and also water areas exist in the examination volume for example, i.e. areas in which more protons bonded into fat or more protons bonded to water are present, a different Larmor frequency will be measured in these areas even with a constant B0 field. This problem occurs anew with the multi-echo methods since most other known B0 mapping methods typically carry out measurements "in phase", meaning that the relevant phase positions of protons bonded into water and into fat coincide and do not lead to any phase difference, thus also do not lead to artifacts as a result of chemical shift. For example, B0 mapping methods are cited in the standard work by M. A. Bernstein, K. F. King and X. J. Zhou, "Handbook of MRI pulse sequences", Elsevier Academic Press, 2004. In these methods, however, many phase wraps occur which are to be classified as critical.

If now, as with the multi-echo methods, different dephasing times are used, it can no longer be insured that the matching of the phase positions of protons bonded into fat and into water continues to exist, so that the chemical shift has an influence on the measurement of the B0 field map. Typically the chemical shift is expressed by a sudden noticeable incidence of the fat-containing regions within the B0 field map. In many applications, such as for example parallel transmission technology or in advanced reconstruction techniques in echoplanar imaging, only one frequency map or B0 field map of the water signal is needed. No correction method is currently available however which removes these sudden fat regions from the B0 field map. A simple segmentation through frequency thresholding would be conceivable, but not practicable, since the chemical shift of fat to water overlaps with the spectrum of susceptibility-related field inhomogeneities, so that a decision as to whether a high deviation from the nominal Larmor frequency is to be attributed to protons bonded into fat or to a field inhomogeneity cannot be made in a simple manner.

SUMMARY OF THE INVENTION

An object of the invention is to provide a correction method that is as reliable as possible but is simple and fast to carry out for the effects of chemical shifts in B0 field maps that have been recorded with multi-echo methods.

This object is achieved by a method of the type described above wherein, in accordance with the invention, the B0 field map is segmented by a segmentation criterion whereby the differences of the Larmor frequency values of neighboring picture elements of the B0 field map are placed in at least two contiguous clusters, particularly clusters containing at least two picture elements that are separated by a jump in the Larmor frequency values, in accordance with which a decision is made for each cluster, on the basis of a smoothness criterion and a compactness criterion, as to whether a cluster containing a majority of protons bonded into fat is involved, wherein the clusters identified as largely containing protons bonded into fat are corrected by lowering the Larmor frequency values by the difference between the nominal frequency for protons bonded into water and the corresponding nominal Larmor frequency for protons bonded into fat.

In this case the method can be carried out fully automatically, for example at a control device of a magnetic resonance device. The basic idea is, initially by using an intelligent segmentation method, to find candidates for areas (clusters) containing a majority of protons bonded into fat, which are then checked and if necessary corrected by criteria relating to the smoothness and the compactness of the frequency distribution in a type of single-step minimization method. Thus a first step of the inventive method divides the B0 field map calculated from the multi-echo method into a set of clusters. A cluster is a set of contiguous picture elements, i.e. of pixels or voxels, which at least in restricted neighboring regions, only differ very little in their Larmor frequency values (frequency deviations), thus show an extremely smooth, flat course of the Larmor frequency values. This means that the Larmor frequency values in neighboring regions of the cluster lie extremely close together, are thus comparable. Despite this the result of the segmentation can still be a cluster, which on opposite sides exhibits markedly different Larmor frequency values, however the course between the sides is then extremely smooth without large gradients, which succeeds by observing neighborhood relationships. Clusters thus also describe regions in the examination object which contain bonded protons.

An example segmentation algorithm can make provision that for the expansion of the cluster, starting from a voxel belonging to the cluster, two adjacent regions, for example contain 27 voxels with 3×3×3 voxels, are compared to the extent that the average value of the Larmor frequency values is determined. If the difference in relation to the region to be checked for membership of the cluster is smaller than a threshold, the region/its picture elements belong to a common cluster. Of course actual segmentation algorithms, which will be discussed in greater detail below, frequently exhibit more complex structures.

The object of the segmentation process is thus to find candidates for fat clusters, i.e. clusters which correspond to regions of the examination object containing a majority of protons bonded into fat, where possible without overlooking such regions in this stage of the inventive method, but larger units less influenced by noise are to be created. As has already been explained in relation to the prior art, artifacts created by chemical shifts are mainly characterized in that clusters containing a majority of protons bonded into fat clearly (suddenly) stand out from surrounding clusters which contain a majority of protons bonded into water. Artifacts resulting from chemical shifts thus have an extremely discrete nature. The reason for this is that only the dominant component in picture elements containing both protons bonded into water and also protons bonded into fat is mapped; in other words no fat-water mixed components exist in the B0 field map, so that the set of clusters can be divided into three disjoint subgroups, namely water, fat and noise. The segmentation involves a preparatory step simplifying the further method and avoiding the consideration of individual picture elements which can be subject to noise effects, in which the necessary jump level to the level of clusters is initially set extremely low, in other words a high sensitivity to disruptions to the smoothness is provided which separate the clusters from one another. This is because it is known that the B0 inhomogeneities usually vary extremely smoothly in space, which contrasts with artifacts as a result of chemical shifts. Ultimately a preselection is thus made by the segmentation method of candidates which are differentiated by a jump, however small it may be, thus by a disruption to the smoothness, from their neighbors.

In such cases the present invention allows fast segmentation methods to be used without user interaction, wherein segmentation methods are preferred which include the spatial adjacency of picture elements and function fully automatically, i.e. without user interaction. Also preferred are methods which do not need any defined starting points, which is why typical region-growing algorithms are less preferred.

In an advantageous embodiment of the present invention there can be provision for a graph-based segmentation algorithm to be used for carrying out the segmentation. Such algorithms have proved to be especially suited to finding clusters which are distinguished from their surroundings by jumps in the Larmor frequency values and also use segmentation criteria which assess the differences of the Larmor frequency values of adjacent picture elements of the B0 field map. Graph-based segmentation algorithms view picture elements as edges for example and apply weights derived from differences of the picture elements, here Larmor frequency values, between these edges. For suitable graph-based segmentation algorithms, reference is made to the article by Pedro F. Felzenszwalb and Daniel P. Huttenlocher, "Efficient graph-based image segmentation", International Journal of Computer Vision 59: 167-181, 2004.

As to the parameterization of such segmentation algorithms it has already been pointed out that for the segmentation in the cluster a subdivision reacting quite sensitively to disruptions of the smoothness is to be realized, however clusters that are too small, for example clusters containing only one picture element, are of course ideally to be avoided.

In the method description that follows, which should be viewed as a minimization method, all clusters are checked in relation to potential chemical shift and corrected if necessary in order to obtain a B0 field map related to protons bonded into water. In this case the steps which now follow, if they are collected together as a minimization method, use two different cost functions, namely a cost function relating to the maximization of the smoothness of the B0 field map, and a cost function aiming for a compactness of the frequency distribution which is as high as possible, but that do not have to be explicitly formulated. In other words the smoothness criterion which is based on the assumption that B0 field inhomogeneities, by contrast with artifacts of chemical shifts, are extremely smooth, relates to checking whether a correction of a cluster leads overall to an increase in the smoothness of the B0 field map, while the compactness criterion primarily relates to spatially isolated clusters or clusters heavily affected by noise which cannot be correctly identified by the smoothness criterion if they primarily contain protons bonded into fat. The compactness criterion makes use of the fact that the average frequency of the cluster should not deviate too greatly from the average frequency of the remaining water clusters in a region of interest around the cluster being examined, so that the assumption used as a starting point is thus that the frequency division within a specific region of interest can be assumed as compact. Thus by correction of clusters containing a majority of protons bonded into fat the smoothness and the (local) compactness of the B0 field map are optimized.

Overall it is thus possible, by using the inventive method, to achieve an unsupervised, fast and efficient correction of artifacts resulting from chemical shift in the B0 field maps which have been recorded in multi-echo methods, thus contain magnetic resonance data recorded at different dephasing times. The invention makes possible the correction of regions which are not necessarily contiguous with overlapping frequency bands.

In an embodiment of the present invention, a water reference cluster can be determined before the use of the smoothness criterion and the compactness criterion. Such a water reference cluster is especially suited to relating the smoothness observations to said cluster, so that the smoothness is not accidentally optimized in respect of a cluster containing a majority of protons bonded into fat. A cluster should thus be found that can be assigned with probability bordering on certainty to a majority of protons bonded into water. For this purpose, in another embodiment of the present invention, the water reference cluster is determined as a cluster showing a lowest deviation from the nominal Larmor frequency value, especially from a reduced set of the preferably five to ten largest segmented clusters. In this case, after adjustment has been made to the nominal Larmor frequency, i.e. the water signal, the cluster with the minimal average Larmor frequency value is selected. Preferably not all the segmented clusters, but only the largest clusters, are considered for this, preferably the five to ten largest clusters. The reason for this is that it has been established that in the examination volume generally a contiguous cluster that contains a majority of protons bonded to water is always to be found among the four largest clusters (it should be noted that with corpulent patients it frequently even occurs that the fatty tissue is contiguous and represented by a single cluster).

It is especially advantageous in this context, for determining the cluster with the smallest deviation, to form the median of the Larmor frequency values of the cluster. The median has proved to be an especially robust statistical variable in this context since it is only slightly sensitive to noise effects.

If the reference cluster is determined first, in a further embodiment of the invention, as a smoothness criterion for each cluster except for the reference cluster, the smoothness of the entire B0 field map for clusters is corrected by testing in relation to chemical shifts to be compared with the smoothness without correction. When an improved smoothness for corrected clusters is established, the correction is then accepted and the cluster is classified as a cluster containing a majority of protons bonded into fat. As noted, the smoothness criterion is based on the fact that B0 inhomogeneities typically vary smoothly in space so that each cluster can be corrected by testing for a possible chemical shift and to check whether the overall smoothness of the B0 field map will be increased by this. If this is the case, it is highly probable that the cluster is a cluster that primarily contains protons bonded into fat (fat cluster). It can be classified accordingly and the correction can be retained. Thus a characteristic variable for the smoothness of the overall B0 field map with and without correction of the cluster currently being considered, which is not the reference cluster, is defined and a comparison is carried out. In this way it is already possible to identify most clusters in which the fat proportion outweighs the water proportion.

In any event, as already described, clusters heavily affected by noise or isolated clusters are not recorded. All clusters identified as primarily containing protons bonded into fat are thus now checked on the basis of the compactness criterion. For each cluster not classified by the smoothness criterion as containing a majority of protons bonded to fat and, if a reference cluster is defined, not corresponding to the reference cluster, as a compactness criterion the cluster can be checked as to whether its average Larmor frequency value lies within or outside a permitted interval around an average Larmor frequency value. This takes into consideration that all clusters of the group that are within a region of interest around the cluster to be checked, were all defined by the smoothness criterion as classified as containing a majority of protons bonded into fat and corrected clusters and, if a reference cluster has been defined, the group contains the reference cluster. For a Larmor frequency value lying outside the interval, the checked cluster is classified as containing a majority of protons bonded to fat and is corrected. This means that the average Larmor frequency value of the cluster should not deviate markedly from the average Larmor frequency value of the clusters certainly known as water type clusters adjacent to the cluster. Precisely those clusters are known as clusters lying in the correct range of the Larmor frequency values for regions containing protons primarily bonded to water which are classified by the smoothness criterion as primarily containing protons bonded into fat, and have been corrected. In addition it is known for the reference cluster that it definitively involves a water cluster. Thus the knowledge obtained in the evaluation of the smoothness criterion is now employed for determining a comparison value for the average frequency of a cluster to be examined, which reflects how, assuming compactness, Larmor frequencies for protons bonded into water should lie. Thus an average Larmor frequency value is determined both for the water clusters lying in the region of interest around the cluster and also for the cluster to be examined, and a check is made as to whether the average Larmor frequency value of the cluster still lies within an interval around the average Larmor frequency value of the water cluster. If it does, then the cluster is assumed to be a further water cluster. If it does not, then the cluster is assumed to be a cluster containing primarily protons bonded to fat. This can be corrected accordingly.

It is expedient not to select the region of interest as the total examination volume which is covered by the B0 field map, since the compactness of the frequency distribution should expediently rather be checked as a local effect. An example of a choice of region of interest makes provision for the slices of the B0 field map containing the corresponding cluster to be selected as the region of interest. Naturally other definitions of the region of interest are also conceivable, which can depend on the volume of the cluster being considered, for example can expand said cluster symmetrically by 27 times or similar.

The interval size around the average Larmor frequency value of the water cluster (cluster containing protons primarily bonded into water or already corrected fat cluster) should ultimately be selected so that average Larmor frequency values shifted by the expected chemical shift for fat should be recognized in any event, so that the interval can be selected for example so that 80% of the chemical shift by fat would still lie within the interval. The stated percentage can be selected as a function of a fluctuation established in the region of interest, for example a variant of the average Larmor frequency value.

In an embodiment of the invention, a fat mask is determined from the clusters classified as containing a majority of protons bonded into fat. This mask is used for at least one subsequent recording and/or evaluation of magnetic resonance data of the same examination object, especially as a starting point for a Dixon technique and/or as part of magnetic resonance spectroscopy. It is thus conceivable for the inventive method to provide the additional benefit of automatically identifying regions with a percentage dominating fat signal, thus the provision of a fat mask. This can be employed in further applications, for example for definition of start values in Dixon techniques and as additional information in the planning and evaluation of spectroscopic examinations. Thus an advantageous multiple use of the inventive method is provided.

In addition to the method, the present invention also concerns a magnetic resonance apparatus having a control device designed for implementing the inventive method. All statements relating to the inventive method are applicable to the inventive magnetic resonance apparatus, with which the benefits of the inventive method can thus also be obtained. The control device, with the use of the inventive method, can undertake an evaluation of previously recorded B0 field maps fully automatically and correct these for artifacts caused by chemical shift. In such cases a fat mask can be produced, which is then made available to other applications.

The present invention also encompasses a non-transitory, computer-readable data storage medium encoded with programming instructions that, when loaded into a control and processing computer system of a magnetic resonance apparatus, cause one or all of the embodiments of the method as described above to be executed. The data storage medium may be, for example, a CD-ROM.

DESCRIPTION OF THE PREFERRED EMBODIMENTS

Figure 1:
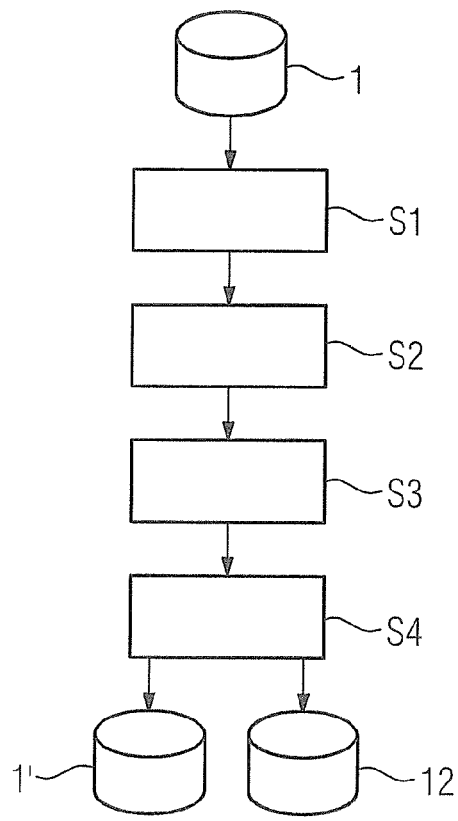
FIG. 1 shows a flowchart of the inventive method.

The starting point for the inventive method, of which a flowchart is shown in FIG. 1, is a B0 field map 1, which contains artifacts resulting from chemical shifts between protons bonded into fat and protons bonded into water. The B0 field map 1 has been recorded in the present example in a multi-echo method, thus a method which uses different dephasing times and is thus not capable of insuring that fat signals and water signals are in phase. Therefore artifacts are produced as a result of chemical shift. These are to be identified and corrected on the basis of the correction method presented here. In this case the method is based on the knowledge that B0 field inhomogeneities, which the B0 field map 1 is designed to map, vary slowly spatially, thus exhibit a high degree of smoothness. By contrast artifacts of chemical shift are characterized by sudden detached areas.

It should be noted in advance that areas without a signal in which thus only noise components are present can of course easily be recognized in a B0 field map and can be excluded from consideration in the present method.

In a first step S1 the portions (containing a signal) of the B0 field map 1 are segmented into N disjoint, contiguous clusters, which are to be labeled $C_n$ below, wherein n runs from 1 to N. Expressed schematically in formulas, wherein B0 symbolizes the B0 field map 1, this means that $$B0 = \Sigma_{n=1}^{N} C_n$$

For segmentation a graph-based segmentation algorithm reacting extremely sensitively to jumps is employed, which assesses neighboring relationships between the individual picture elements of the B0 field map 1 as part of a segmentation criterion. In this way it can be established whether picture elements or regions belong to a common cluster or not. The clusters are thus separated from one another by jumps in the deviation from the nominal Larmor frequency for protons bonded into water for Larmor frequency values describing the magnetic resonance device, as is usual for segmentation methods, wherein it is entirely conceivable for a slow, smooth change of the Larmor frequency value to also occur within a cluster. In general, however, a cluster herein is a group of picture elements that, at least in adjacent areas, exhibit a comparable Larmor frequency value.

The clusters ultimately represent candidates for fat clusters, i.e. those which primarily contain signals from protons bonded into fat. Whether a cluster is a fat cluster is checked in the following steps on the basis of two different criteria, namely a smoothness criterion, which is more sensitive than the segmentation carried out in step S1, and a compactness criterion. Clusters identified as fat clusters are corrected by subtraction of the chemical shift between water and fat.

Initially in step S2, a reference cluster is defined that is innately a water cluster, thus reproduces signals of a region of the examination volume in which there are more protons bonded into water than protons bonded into fat present. To do this, the clusters found in step S1 are arranged in ascending order according to their size and in this description only the seven largest clusters will be considered further. Since the Larmor frequency values are selected here so that a Larmor frequency value of 0 describes no deviation from the specified Larmor frequency of the magnetic resonance device for protons bonded to water, that cluster among the largest clusters that exhibits the smallest average Larmor frequency value is selected. For this purpose, the median is selected as the median value of the Larmor frequency values, since this is especially robust with respect to noise effects. Thus $$C^{ref} = \arg_i \min(\text{median}(C_i - 0))$$

The reason for this is that, in the examination volume recorded in the B0 field map 1, as a rule a contiguous water region is always to be found among the four largest clusters. The smoothness is now optimized in the following step S3 in relation to the reference cluster $C_{ref}$.

In this step each cluster $C_n$, except for the reference cluster $C_{ref}$, is now corrected individually for a possible chemical shift. If the overall smoothness of the B0 field map 1 is increased by this step, it is to be assumed that the cluster is a fat cluster, so that it is marked accordingly and the correction is retained. If the smoothness is not increased the step continues with the next cluster. This method is explained in greater detail schematically by the diagram in FIG. 2. This diagram shows an example of a slice 2 of the B0 field map 1 in which for purposes of presentation only a few clusters 3, 4, 5 and 6 are shown here. Areas without clusters in slice 2 indicate no signal was present here, especially since air or the like existed there.

In this example, cluster 5 represents the reference cluster, from which the other clusters 3, 4 and 6 have deviating average Larmor frequency values, which is represented by the different shadings in the part image on the left. The arrow 7 symbolizes the correction of the cluster 6 for a possible chemical shift. In the part image 2 on the right it can be seen, as is represented by the removal of the shading 6, that the Larmor frequency value of the cluster 6 now essentially corresponds to the Larmor frequency value of the cluster 5, a smooth transition is produced. The cluster 6 is thus a fat cluster, the correction is retained. The improved smoothness is clearly to be seen in the right-hand part image of FIG. 2.

This method of operation means:

$$\text{cost}_{old} = \Sigma abs(\nabla B0)$$

For each $C_n$, which does not correspond to the reference cluster $C_{ref}$, do:

$$\text{cost}_{new} = \Sigma abs(\nabla(B0|C_n + (C_n - \Delta\omega_{FW}))),$$

wherein, when $\text{cost}_{new} \leq \text{cost}_{old}$:

$$\text{cost}_{old} = \text{cost}_{new}$$

$$B = B0|C_n + (C_n - \Delta\omega_{FW})$$

Figure 2:
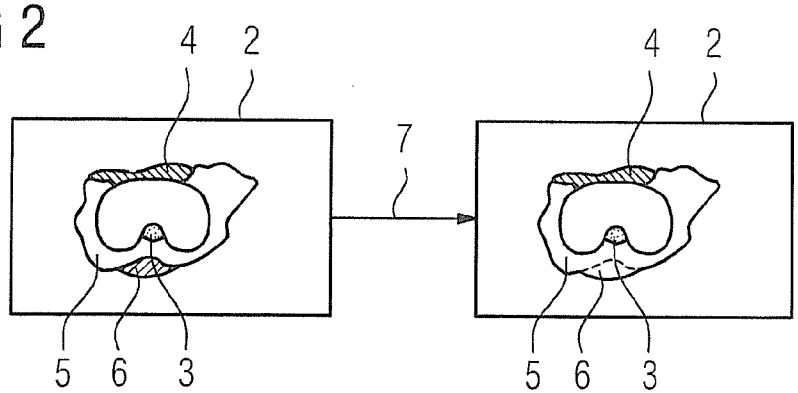
FIG. 2 illustrates correction by use of the smoothness criterion in accordance with the invention.

In this case, cost symbolizes the smoothness able to be expressed as a cost function, B0 the B0 field map 1, $\Delta\omega_{FW}$ the chemical shift between protons bonded into fat and into water at the nominal Larmor frequency and $B0|C_n$ symbolically B0 without the current cluster $C_n$ to be checked (in FIG. 2 the cluster 6).

Figure 3:
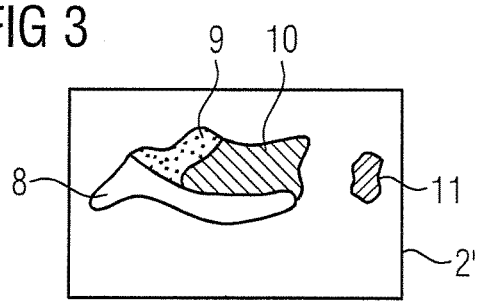
FIG. 3 shows the option of correction by use of the compactness criterion in accordance with the invention.

While it is already possible with this step to identify and to correct the greater part of the fat clusters, fat clusters remain that are spatially isolated or have a high noise level, since these can only be identified with difficulty by the smoothness criterion in step S3. This is to be illustrated in greater detail by the basic diagram of FIG. 3, which shows a further slice 2' of the B0 field map 1, in which once again, for the sake of simplicity, only a few clusters 8, 9, 10, 11 are shown. Evidently the cluster 11 is isolated from the clusters 8, 9 and 10, since a region without a signal is located between them, so that in a correction of the cluster 11 by means of testing for no influence or only an extremely low influence on the smoothness of the B0 field map 1 occurs. If however for example the slice 2', in which the cluster 11 lies, is viewed as a region of interest, in which a compactness of the distribution of the Larmor frequency values can be used as a starting point, and if the clusters 9 and 10 have also already been identified in step S3 as fat clusters, it can be assumed that the corrected version of the clusters 9 and 10 are water clusters, thus contain usual Larmor frequency values in protons bonded into water for the region of interest. A compactness of the distribution of the Larmor frequency values would now mean that the average Larmor frequency value of the cluster 11 might not deviate too greatly from the average Larmor frequency value of the cluster 9 and 10, so that the cluster 11 can also be identified as a water cluster.

Thus in step S4, the average Larmor frequency values are initially determined for the cluster 11, but also for the corrected fat clusters 9 and 10, which are water clusters in their corrected form, wherein it should be pointed out that of course the reference cluster is basically viewed and considered as a water cluster if it is contained in the region of interest. Only when the average Larmor frequency value of the cluster 11 to be examined within an interval lies around the average Larmor frequency value of the water cluster in the region of interest, is it to be assumed that the cluster 11 is a water cluster, otherwise it is classified as a fat cluster 11 and subjected to a corresponding correction. Again expressed schematically in formulas this means $$|\overline{C_n}|_{ROI} < f * |\overline{\sum_{i \in Water} C_i}|_{ROI},$$

wherein the horizontal line over the clusters indicates the averaging of the Larmor frequency values and f represents the factor which defines the interval. This is to be selected so that the interval, although it extends into the area of the chemical shift between water and fat, naturally does not reach this area, for example up to 60-80% of the value for the chemical shift between protons bonded into water and protons bonded into fat.

The result of the inventive method is then the corrected B0 field map 1″ and also, since the identified fat clusters have been marked, a fat mask 12 which can be employed to advantage in further applications.

Figure 4:
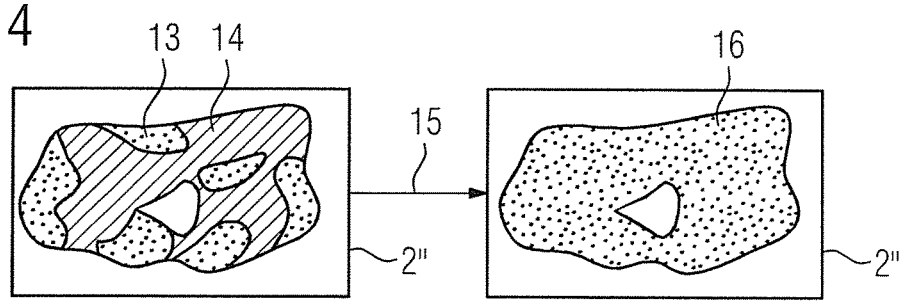
FIG. 4 shows the effects of correction in accordance with the invention.

FIG. 4 again explains schematically the effects of the inventive method on the basis of a slice 2″ of the B0 field map 1, which forms the left-hand part image of FIG. 4. As is shown by the shading, markedly different, clearly separated regions 13, 14 of Larmor frequency values exist in this diagram, as is shown by the dotted/hatched areas. The execution of the inventive method, arrow 15, leads to a correction of this chemical shift and to a contiguous smooth region 16 of Larmor frequency values, which reproduce the B0 inhomogeneities, as is shown in the slice 2″ of the corrected B0 field map 1′, i.e. the right-hand part image.

Figure 5:
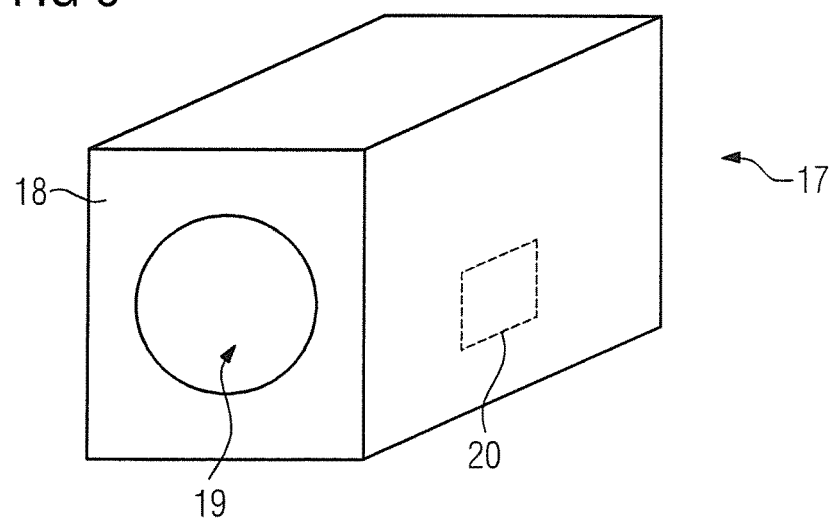
FIG. 5 schematically illustrates a magnetic resonance device in accordance with the invention.

Finally FIG. 5 shows a block diagram of an inventive magnetic resonance device 17, which, as is basically known, has a basic field magnet unit 18 with magnets generating the basic magnetic field B0. The basic field magnet unit 18 defines a patient receptacle 19, which is surrounded (not shown in greater detail) by the gradient coil arrangement and the radio frequency coil arrangement, as is basically known.

The components of the magnetic resonance device 17 are controlled by a control device 20, which is also designed to implement the inventive method. In particular, a computer program represented by code on a storage medium can run in the control device 20, when the storage medium is loaded into the control device 20.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for correction of a B0 field map measured with a magnetic resonance device in which an examination object is situated, describing deviations from a nominal field strength in a homogeneity area of the magnetic resonance device by deviations from a nominal frequency for protons bonded into water, the deviations being represented as Larmor frequency values for different picture elements resulting from chemical shifts of the Larmor frequencies, wherein the B0 field map was recorded at least in part with spins of fat and water protons in the examination object not in phase, said method comprising:
    segmenting the B0 field map according to a segmentation criterion that evaluates the differences of the Larmor frequency values of adjacent picture elements of the B0 field map in at least two contiguous clusters, each containing at least two picture elements, that are separated by a jump in the Larmor frequency values;
    for each cluster, determining, based on a smoothness criterion and a compactness criterion, whether the respective cluster contains a majority of protons bonded into fat; and
    correcting clusters identified as containing a majority of protons bonded into fat by lowering the Larmor frequency values thereof by a difference between the nominal frequency for protons bonded into water and the corresponding nominal frequency for protons bonded into fat.

2. The method as claimed in claim 1, comprising using a graph-based segmentation algorithm for the segmentation.

3. The method as claimed in claim 1, comprising identifying a water reference cluster before the application of the smoothness criterion and the compactness criterion.

4. The method as claimed in claim 3, comprising determining the water reference cluster as a cluster showing the smallest deviation from the nominal Larmor frequency.

5. The method as claimed in claim 4 comprising determining the water reference cluster as a cluster showing the smallest deviation from the nominal Larmor frequency among a set of the segmented clusters comprising between five and ten of the largest segmented clusters.

6. The method as claimed in claim 4, comprising forming the median of the Larmor frequency values of the respective cluster for determining the smallest deviation from the nominal Larmor frequency.

7. The method as claimed in claim 3, comprising using a smoothness of the B0 field map for clusters corrected in testing in relation to the chemical shift as the smoothness criterion for each cluster except for the reference cluster with the smoothness without correction and, when an improved smoothness is established for corrected clusters, accepting the correction and classifying the cluster as a cluster containing a majority of protons bonded into fat.

8. The method as claimed in claim 1, comprising, as the compactness criterion for each cluster not classified by the smoothness criterion as containing a majority of protons bonded into fat and, if a reference cluster has been defined, as not corresponding to the reference cluster, checking whether an average Larmor frequency value of that cluster is within or outside a permitted interval around an average Larmor frequency value determined for all clusters of the group lying within a region of interest around the cluster to be checked, which contains all clusters classified by the smoothness criterion as containing a majority of protons bonded into fat and, if a reference cluster has been defined, contains the reference cluster, wherein for an average Larmor frequency value lying outside the interval, the checked cluster is classified as containing a majority of protons bonded into fat and corrected.

9. The method as claimed in claim 7, comprising selecting a slice of the B0 field map containing the cluster to be checked as a region of interest.

10. The method as claimed in claim 1, comprising determining a fat mask from the clusters classified as containing a majority of protons bonded into fat and using said fat mask in at least one later recording and/or evaluation of magnetic resonance data of the same examination object.

11. The method as claimed in claim 10 comprising using said fat mask as a starting point for a Dixon technique for acquiring magnetic resonance data from said examination object.

12. A method as claimed in claim 10 comprising using said fat mask in an acquisition of magnetic resonance spectroscopic data from said examination object.

13. A magnetic resonance apparatus comprising:
a magnetic resonance data acquisition scanner in which an examination subject is situated;
a control computer configured to operate said magnetic resonance data acquisition scanner to acquire a B0 field map describing deviations from a nominal field strength in a homogeneity area of the magnetic resonance data acquisition scanner, by deviations from a nominal frequency for protons bonded into water, the deviations being represented as Larmor frequency values for different picture elements resulting from chemical shifts of the Larmor frequencies, with said B0 field map being acquired at least in part with spins of fat and water protons in said examination subject not being in phase;
a processing computer provided with said B0 field map, said processing computer being configured to segment the B0 field map according to a segmentation criterion by evaluating differences of the Larmor frequency values of adjacent picture elements of the B0 field map in at least two contiguous clusters, each containing at least two picture elements, that are separated by a jump in the Larmor frequency values;
in said processing computer, for each cluster, determining, based on a smoothness criterion and a compactness criterion, whether the respective cluster contains a majority of protons bonded into fat;
in said processing computer, correcting clusters identified as containing a majority of protons bonded into fat by lowering the Larmor frequency thereof by a difference between the nominal frequency for protons bonded into water and the corresponding nominal frequency for protons bonded into fat; and
generating a corrected B0 field map from all corrected clusters, and making the corrected B0 field map available in electronic form as a data file at an output of said processing computer.

14. A non-transitory, computer-readable data storage medium encoded with programming instructions, said storage medium being loaded into a computer of a magnetic resonance apparatus and said programming instructions causing said computer to:
receive a B0 field map, for correction of said B0 field map, acquired by operation of said magnetic resonance apparatus with an examination object situated therein, said B0 field map describing deviations from a nominal field strength of a homogeneity area of the magnetic resonance apparatus by deviations from a nominal frequency for protons bonded into water, the deviations being represented as Larmor frequency values for different picture elements resulting from chemical shifts of the Larmor frequencies, said B0 field map having been acquired at least in part with spins of fat and water protons in the examination object not being in phase;
segment the B0 field map according to a segmentation criterion that evaluates the differences of the Larmor frequency values of adjacent picture elements of the B0 field map in at least two contiguous clusters, each containing at least two picture elements, that are separated by a jump in the Larmor frequency values;
for each cluster, determine, based on a smoothness criterion and a compactness criterion, whether the respective cluster contains a majority of protons bonded into fat; and
correct clusters identified as containing a majority of protons bonded into fat by lowering the Larmor frequency values thereof by a difference between the nominal frequency for protons bonded into water and the corresponding nominal frequency for protons bonded into fat.

* * * * *